(12) United States Patent
Abert et al.

(10) Patent No.: US 6,196,881 B1
(45) Date of Patent: Mar. 6, 2001

(54) DEVICE FOR CODING PLUG RECEPTACLES

(75) Inventors: Michael Abert, Au; Kurt Balzer, Hagenbach; Siegfried Morlock, Remchingen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/308,761

(22) PCT Filed: Nov. 20, 1997

(86) PCT No.: PCT/DE97/02725

§ 371 Date: Jul. 22, 1999

§ 102(e) Date: Jul. 22, 1999

(87) PCT Pub. No.: WO98/24153

PCT Pub. Date: Jun. 4, 1998

(30) Foreign Application Priority Data

Nov. 22, 1996 (DE) .......................................... 296 20 410 U

(51) Int. Cl.⁷ .................................................. H01R 13/64
(52) U.S. Cl. .............................................. 439/681; 439/633
(58) Field of Search ..................................... 439/681, 680, 439/633, 61, 347, 796

(56) References Cited

U.S. PATENT DOCUMENTS

| | | | |
|---|---|---|---|
| 4,307,927 | 12/1981 | Mollman | 439/681 |
| 4,579,412 | 4/1986 | Czeschka et al. | 439/347 |
| 4,595,250 | 6/1986 | Joly et al. | 439/61 |
| 5,402,320 | 3/1995 | Kielstra et al. | 361/796 |

FOREIGN PATENT DOCUMENTS

| | | |
|---|---|---|
| 586 962 | 4/1977 | (CH) . |
| 607 542 | 12/1978 | (CH) . |
| 28 07 017 | 8/1979 | (DE) . |
| 37 25 498 | 2/1989 | (DE) . |
| 38 30 187 | 3/1990 | (DE) . |
| 43 23 440 | 2/1995 | (DE) . |
| 44 20 984 | 12/1995 | (DE) . |

*Primary Examiner*—Brian Sircus
*Assistant Examiner*—Son V. Nguyen
(74) *Attorney, Agent, or Firm*—Kenyon & Kenyon

(57) ABSTRACT

A device for the coding of plug receptacles in a support unit for electronic modules is described. Coding slides having a pin are provided on the support unit for each plug receptacle so that only those modules having a recess for the pin corresponding to a particular position of the coding slide can be inserted into the particular plug receptacle. This prevents, for example, modules with 24 V direct current supply from being inserted into plug receptacles wired for 230 V alternating current and vice versa.

5 Claims, 2 Drawing Sheets

DEVICE FOR CODING PLUG RECEPTACLES

FIELD OF THE INVENTION

The present invention relates to a device for coding plug receptacles.

BACKGROUND INFORMATION

A device for the connection of external lines to a programmable logic controller is described in German Patent No. 43 23 440 A1, the device being coupled to the programmable logic controller for signal transmission and being capable of being installed separately from it. The terminal unit allows for a modular structure in which a terminal is available for each actuator/sensor connection, it being correspondingly possible to provide each connection type with an electronic module for signal conversion. Input and output modules can thus be mixed as desired. This has an advantageous effect on project planning, installation, troubleshooting or expansion of the electronic device. At the same time, the terminal unit functions as a support unit for the electronic modules and has a plurality of identical plug receptacles for them. Both feeder and signal lines are connected to the electronic modules via a plug-in connector at the plug receptacle. Electronic modules with different operating voltages, e.g., 230 V alternating current or 24 V direct current, can be used. The wiring via the plug-in connector at the plug receptacle does indeed facilitate the replacement of electronic modules; however, at the same time. It also increases the risk of confusing them. This can result in problems, since the particular type of the electronic module to be inserted in a plug receptacle, its supply voltage in particular, is determined after wiring of the device for the connection of external lines has been completed.

SUMMARY

An object of the present invention is to create a device for the coding of plug receptacles which prevents electronic modules from being inserted into plug receptacles for which they are not suitable.

The present invention has the advantage that in addition to the support unit and electronic modules, no additional parts are needed for the coding. The coding slide is fixedly attached to the support unit and can thus not become lost during transport or startup of the device for the connection of external lines. Only one recess is provided on the electronic modules for coding at the time of manufacture, which causes no additional expense. If the wiring of the device is modified for the connection of external lines, the position of the slide can be adjusted easily so that the advantage of free interchangeability of electronic modules in the plug receptacles of the support unit is preserved even after modifications. Making it possible to adjust the slide only with a tool rules out unintentional manipulations when handling the support unit. A position of the coding slide in which no module can be inserted into the particular plug receptacle is advantageous. When the unit is delivered, all coding slides of the support unit are in this position. This ensures that the user must consciously match the coding slide to the selected wiring after the completion of wiring. After that, the correct module type can be inserted into the plug receptacles. In an advantageous manner, the device for coding plug receptacles requires no interfering parts projecting out of the support unit if the pins project into insertion slots on the plug receptacles.

In order to increase the number of code variants at a plug receptacle, coding slides with a plurality of lock-in positions, or several coding slides, can be used for one plug receptacle, offering a large number of possible combinations.

DETAILED DESCRIPTION

Figure 1:
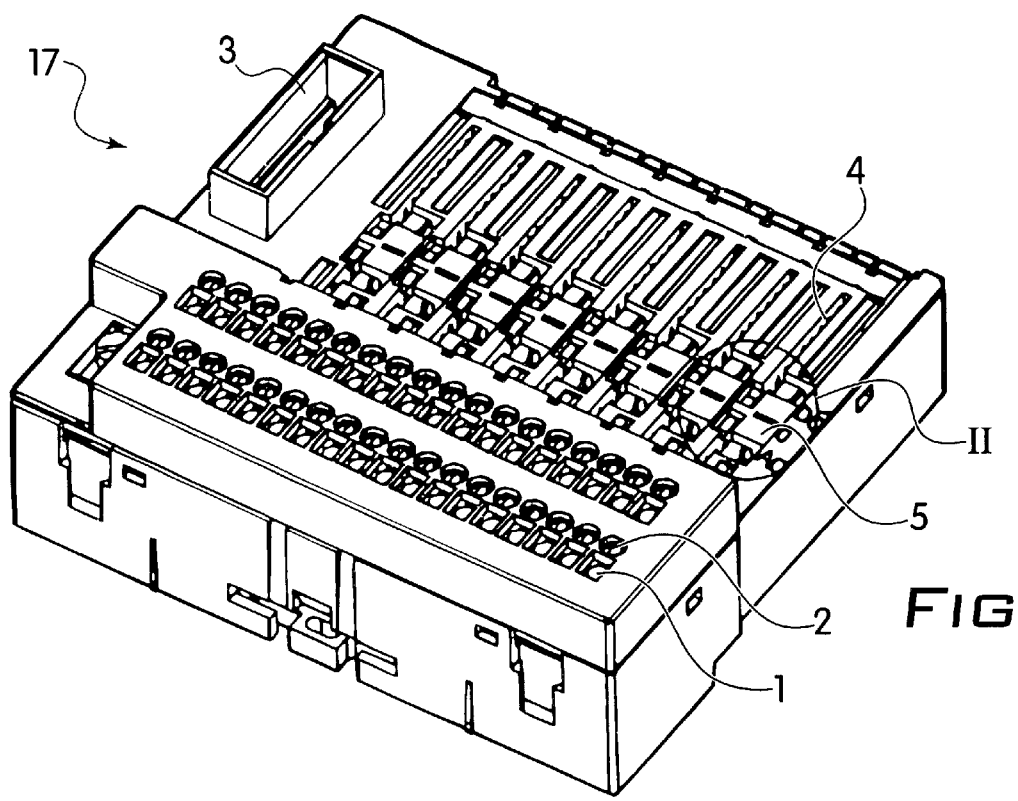
FIG. 1 shows a support unit according to the present invention.

A support unit 17 according to FIG. 1 serves as a device for the connection of external lines and its front is provided with two rows of terminals on for this purpose. Stripped ends of conductors are inserted into terminals via openings 1, it being possible to release the terminals with a tool via operating openings 2. The terminal unit can be connected to a remote control, e.g., a personal computer or programmable controller, via a cable terminal 3, the remote control having a suitable communications interface. In order to convert the type of signal on the connected external lines, electronic modules can be inserted into eight plug receptacles which are arranged adjacent to each other in the top front portion of the support unit. The right plug receptacle is provided with reference symbol 4. The electronic modules have uniform external dimensions and are therefore interchangeable in any desired combination. Both the signal lines as well as the power supply lines are fed into the electronic modules via the plug receptacles. The operating voltage applied to a plug receptacle is not yet determined before the wiring of the terminals belonging to the individual plug receptacles is completed. After wiring, however, the module type which can be inserted into a plug receptacle is predetermined and must be set using a coding slide 5. When the unit is delivered, coding slide 5 is set to the "0" position in which no electronic module can be inserted into the plug receptacle. Depending on the wiring, coding slide 5 is moved to a position "DC" or to a position "AC," in which only a module with direct current supply according to FIG. 3 or a module with alternating current supply according to FIG. 4, respectively, can be inserted. This prevents a module with 24 V direct current from being inserted into plug receptacles wired for 230 V alternating current and vice versa.

Figure 2:
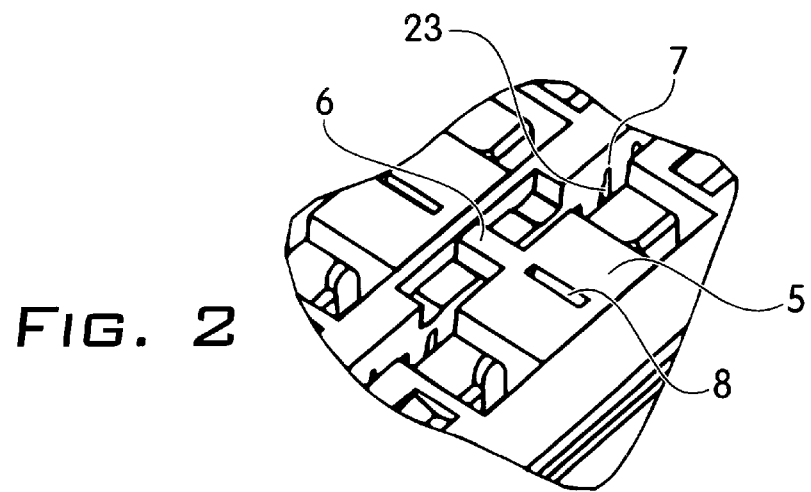
FIG. 2 shows a section from FIG. 1 with an enlarged view of a coding slide according to the present invention.

FIG. 2 shows an enlarged view of coding slide 5. With a pin 6, coding slide 5 projects into an insertion slot 7 in which the spring contacts 23 for contacting the contact surfaces of an electronic module are contained. A slot 8 is located on the top of coding slide 5, it being possible to insert a screwdriver blade into the slot to change the coding of the plug receptacle. The dimensions of the coding slide and its surroundings as well as the forces required for adjustment must be designed in such a way that a change of position is impossible without the aid of a tool. This rules out unintentional manipulations.

Figure 3:
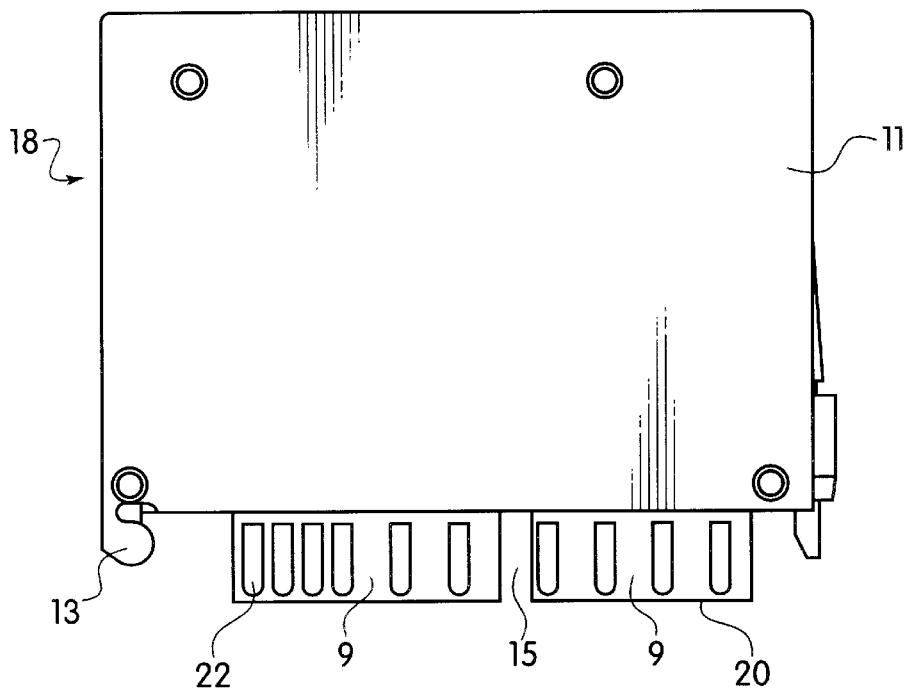
FIG. 3 shows an electronic module for the supply of direct current according to the present invention.
Figure 4:
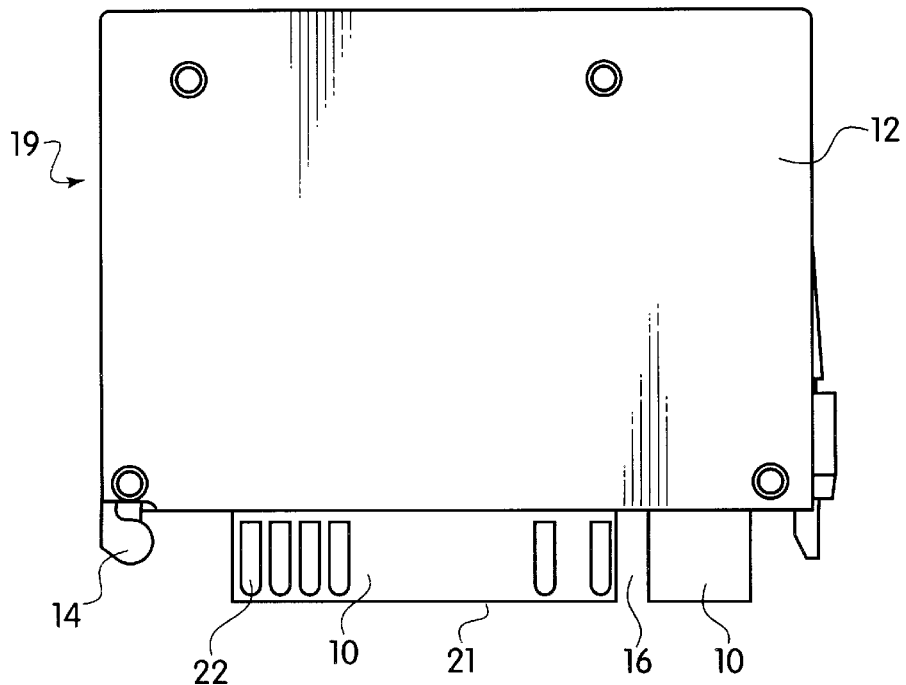
FIG. 4 shows an electronic module for the supply of alternating current according to the present invention.

As shown in FIGS. 3 and 4, electronic modules 18,19 may include an assembled printed circuit board 9 or 10 which is contained in a housing 11 or 12 and which projects laterally past the housing on the side with which it is inserted into insertion slots of the support unit. For insertion into the support unit shown in FIG. 1, the electronic modules are latched into the top edge of the support unit with a fulcrum pin 13 or 14 and pivoted downwards so that, with contact surfaces 22 on their top, the lateral edges of printed circuit board 9 or 10 form a plug-in connection with contact springs in the insertion slots. In order to allow an electronic module for direct current supply to be inserted only into an appropriately wired plug receptacle, the lateral edge 20 is provided with a recess 15 corresponding to the position of pin 6 in the position "DC" of coding slide 5. In a similar manner, lateral edge 21 is provided with a recess 16 that is positioned on the module for alternating current supply shown in FIG. 4 so that this module can only be inserted into a plug receptacle in which the coding slide is located in the position "AC."

Although in the exemplary embodiment the present invention was described on the basis of a device for the connection of external lines as a support unit and conversion modules as electronic modules for the plug receptacles of the support unit, the invention is also suitable for the coding of plug receptacles in any other support units. For example, it can be used for the coding of the plug receptacles of subassemblies in a module frame or of plug receptacles for front panel connectors on a programmable logic controller equipped with input modules or output modules.

What is claimed is:

1. A coding device, comprising:

electronic modules, each of the electronic modules having a laterally projecting edge;

plug receptacles arranged in a support unit, each of the plug receptacles having an insertion slot, the insertion slot configured so that the laterally projecting edge can be inserted in the insertion slot; and at least one coding slide, each of the at least one coding slide corresponding to one of the plug receptacles, and having a length each of the at least one coding slide being configured to slide along the length of the coding slide and lock in between a plurality of positions on the support unit and having a pin projecting across the insertion slot of the one of the plug receptacles so that only the electronic modules having a recess for the pin corresponding to a locked position of the plurality of positions of the at least one coding slide can be inserted into the one of the plug receptacles.

2. The device according to claim 1, wherein the plurality of positions includes a position in which no module can be inserted into the one of the plug receptacles.

3. The device according to claim 1, wherein the electronic modules are subassemblies, the laterally projecting edge is a printed circuit board edge provided with contact surfaces, and the insertions slot is provided with contact springs.

4. A support unit for electronic modules, comprising:

plug receptacles, each of the plug receptacles having an insertion slot, the insertion slot configured so that edges of the electronic modules can be inserted in the insertion slot;

at least one coding slide, each of the at least one coding slide corresponding to one of the plug receptacles, and having a length each of the at least one coding slide being configured to slide along the length of the coding slide and lock in between a plurality of positions on the support unit and having a pin projecting across the insertion slot of the one of the plug receptacles so that only the electronic modules having a recess for the pin corresponding to a locked position of the plurality of positions of the at least one coding slide can be inserted into the one of the plug receptacles.

5. An electronic module for insertion into a plug receptacle in a support unit, comprising:

the module having a laterally projecting edge corresponding to an insertion slot of the plug receptacle, the edge having a recess corresponding to a pin of a coding slide, the pin projecting across the insertion slot, the coding slide corresponding to the plug receptacle and having a length being configured to slide along the length of the coding slide and lock in between several positions on the support unit.

* * * * *